United States Patent [19]
Lee et al.

[11] Patent Number: 5,953,622
[45] Date of Patent: Sep. 14, 1999

[54] METHOD FOR FABRICATING SEMICONDUCTOR WAFERS

[75] Inventors: Sahng Kyoo Lee; Sang Kyun Park, both of Kyoungki-do, Rep. of Korea

[73] Assignee: Hyundai Electronics Industries Co., Ltd., Ichon-Shi, Rep. of Korea

[21] Appl. No.: 08/929,793

[22] Filed: Sep. 15, 1997

[30] Foreign Application Priority Data

Nov. 23, 1996 [KR] Rep. of Korea ............... 96-56895

[51] Int. Cl.⁶ .................................................. H01L 21/76
[52] U.S. Cl. ............................................ 438/458; 438/406
[58] Field of Search .................................. 438/406, 458, 438/FOR 222, FOR 64; 148/DIG. 12

[56] References Cited

U.S. PATENT DOCUMENTS 5,256,581 10/1993 Foerstner et al. .
5,298,449 3/1994 Kikuchi .
5,360,752 11/1994 Brady et al. .
5,374,564 12/1994 Bruel .
5,494,835 2/1996 Bruel .
5,559,043 9/1996 Bruel .
5,714,395 2/1998 Bruel .

*Primary Examiner*—George Fourson
*Attorney, Agent, or Firm*—Thelen Reid & Priest, L.L.P.

[57] ABSTRACT

A method for fabricating silicon-on-insulator (SOI) wafers which is capable of simplifying the fabrication process while improving the productivity of SOI wafers. In accordance with this method, a first wafer formed with a thermal oxide film is bonded to a second wafer formed with an oxygen ion-implanted region and a hydrogen ion-implanted region. The bonded wafer structure is annealed and then cut along the hydrogen ion-implanted region, so that it is divided into two wafer structures. The wafer structure including the first wafer is annealed to obtain a strengthened chemical coupling property. The wafer structure including the second wafer is annealed to oxidize the oxygen ion-implanted region of the second wafer, thereby forming an oxide film in the second wafer. The first and second wafers are then planarized, thereby forming a pair of SOI wafers.

20 Claims, 4 Drawing Sheets

METHOD FOR FABRICATING SEMICONDUCTOR WAFERS

BACKGROUND OF THE INVENTION

1. Field of the Invention

The present invention relates to a method for fabricating semiconductor devices, and more particularly to a method for fabricating a semiconductor wafer capable of achieving a mass production of silicon-on-insulator (SOI) devices while reducing manufacturing costs and improving the productivity and throughput.

2. Description of the Prior Art

In the fabrication of semiconductor devices, formation of an SOI structure is involved to achieve an isolation between adjacent elements, thereby obtaining a superior electrical characteristic. Such an SOI structure is made by forming a silicon oxide film as an insulator on an under silicon substrate and forming another silicon substrate (to be used as an active substrate), for example, a single-crystalline silicon layer on the silicon oxide film. By virtue of an easy element isolation and a superior electrical characteristic of the SOI structure, a number of research efforts have been made in association with SOI semiconductor wafer formation techniques.

Generally, bulk metal oxide semiconductor field effect transistors (MOSFET's) have a 4-terminal structure consisting of a gate, a source, a drain and a silicon substrate. However, MOSFET's having an SOI structure do not require connection of contacts and associated lines to the silicon substrate, as differently from the bulk MOSFET's. Accordingly, MOSFET's having an SOI structure have a 3-terminal structure consisting of a gate, a source and a drain so that they can have a compact chip size.

In the fabrication of CMOS devices using MOSFET's having the above-mentioned SOI structure, it is unnecessary to form wells. In this case, neighboring active regions of MOSFET's are insulated from one another. Accordingly, it is possible to prevent the occurrence of a latch-up phenomenon.

In the case of an SOI device fabricated on a silicon thin film having a small thickness, its source/drain junction is formed throughout the thickness of the silicon thin film. The source/drain has little area junction capacitance. In this case, only a perimeter junction capacitance exists.

In this regard, SOI devices exhibit high-speed low-power consumption characteristics, as compared to bulk MOSFET's.

In addition, SOI wafers reduce a capacitive coupling occurring between the circuit elements of the entire IC chip and the latch-up of the CMOS circuit while reducing the chip size and increasing the packing density, thereby increasing the operating speed of the entire circuit. It is also possible to reduce a generation of parasitic capacitance.

Furthermore, SOI wafers have advantages such as a reduction in the hot electron effect and a reduction in the short channel effect.

Meanwhile, SOI wafers are mainly fabricated using a bond and etch (BE) method or a separation by implanted oxygen (SIMOX) method. In accordance with the BE method, two wafers are bonded to each other, and one of the bonded wafers is processed to have a reduced thickness. In accordance with the SIMOX method, oxygen is implanted in the semiconductor substrate. The oxygen-implanted semiconductor substrate is then annealed, thereby forming a buried oxide film and a silicon film. Recently, a smart cut method has been used in some cases.

Now, a conventional method for fabricating an SOI wafer will be described in conjunction with FIGS. 1 to 5.

FIGS. 1 to 5 are sectional views respectively illustrating sequential steps of the conventional SOI wafer fabrication method which uses a conventional smart cut method.

In accordance with the conventional method, a first wafer 1 and a second wafer 11 are first prepared, as shown in FIG. 1. A thermal oxide film 3 is then formed to a desired thickness over the first wafer 1.

Thereafter, hydrogen ions are implanted in the first wafer 1, thereby forming a hydrogen ion-implanted region 5 deeper than the thermal oxide film 3, as shown in FIG. 2.

The implantation of hydrogen ions is carried out using ion implantation energy of 10 KeV to 2 MeV and a dose of $1 \times 10^{16}/cm^2$ to $1 \times 10^{17}/cm^2$.

The first wafer 1 is subsequently bonded to the second wafer 12 which is a bare wafer, as shown in FIG. 3. At this time, the thermal oxide film 3 formed over the first wafer 1 is bonded to the upper surface of the second wafer 11.

The resulting structure, in which the first and second wafers 1 and 11 are bonded to each other, is annealed at a temperature of about 400 to 600° C.

As shown in FIG. 4, the resulting structure is cut along its portion where the hydrogen ion-implanted region 5 is formed, thereby dividing it into an SOI wafer including the second wafer 11 and a bare wafer including the first wafer 1.

The SOI wafer 10 also includes the thermal oxide film 3 disposed over the second wafer 11 and the cut portion of the first wafer 1 disposed over the thermal oxide film 3 in a bonded state.

The SOI wafer 10 is annealed at a high temperature of 900° C. or above so that it has a strengthened chemical coupling property. The SOI wafer 10 is also subjected to a touch polishing using a chemical mechanical polishing (CMP) device so that the roughness of its surface is reduced. Thus, an SOI wafer capable of achieving an easy fabrication of semiconductor devices at subsequent steps is obtained.

However, the above-mentioned conventional method has various problems, as shall be described.

In accordance with the conventional method, an SOI wafer is fabricated by implanting hydrogen ions in a wafer formed with a thermal oxide film, bonding a bare wafer to the hydrogen ion-implanted wafer, and cutting the resulting structure into an SOI wafer portion and a bare wafer portion along the hydrogen ion-implanted portion.

Since the SOI wafer fabricated in the above-mentioned manner has a rough surface, it is required to perform a polishing process in order to reduce the surface roughness of the wafer. The remaining bare wafer is reused to fabricate an SOI wafer.

However, where an SOI wafer is fabricated by reusing the above-mentioned remaining bare wafer, the fabrication process is complicated, thereby increasing costs. In this case, it is also impossible to achieve mass production.

SUMMARY OF THE INVENTION

Therefore, an object of the invention is to solve the above-mentioned problems involved in the prior art and to provide a method for fabricating SOI wafers which is capable of simplifying the fabrication process while improving the productivity of SOI wafers.

One aspect of the present invention provides a method for fabricating semiconductor wafers, comprising the steps of:

providing a first wafer and a second wafer; forming a thermal oxide film over the first wafer; implanting oxygen ions in the second wafer, thereby forming an oxygen ion-implanted region; implanting hydrogen ions in the second wafer, thereby forming a hydrogen ion-implanted region shallower than the oxygen ion-implanted region; bonding the upper surface of the second wafer to the upper surface of the thermal oxide film formed over the first wafer; annealing the bonded wafers; cutting the bonded wafers along the hydrogen ion-implanted region, thereby forming a first silicon-on-insulator (SOI) wafer and a bare wafer; annealing the first SOI wafer, thereby strengthening a chemical coupling property of the first SOI wafer; annealing the bare wafer in such a manner that the oxygen ion-implanted region included in the bare wafer is oxidized, thereby forming a second SOI wafer; and planarizing the surfaces of the first and second SOI wafers.

Another aspect of the present invention provides a method for fabricating semiconductor wafers, comprising the steps of: providing a first wafer and a second wafer; forming a first thermal oxide film over the first wafer; forming a second thermal oxide film over the second wafer; sequentially implanting oxygen ions and hydrogen ions in the second wafer, thereby forming an oxygen ion-implanted region and a hydrogen ion-implanted region; bonding the upper surface of the second wafer to the upper surface of the first wafer; annealing the bonded wafers; cutting the bonded wafers along the hydrogen ion-implanted region, thereby forming a first silicon-on-insulator (SOI) wafer and a bare wafer; annealing the first SOI wafer, thereby strengthening a chemical coupling property of the first SOI wafer; annealing the bare wafer in such a manner that the oxygen ion-implanted region included in the bare wafer is oxidized, thereby forming a second SOI wafer; and planarizing the surfaces of the first and second SOI wafers.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 6 to 10 are sectional views respectively illustrating sequential steps of a method for fabricating an SOI wafer in accordance with a first embodiment of the present invention.

Figure 1:
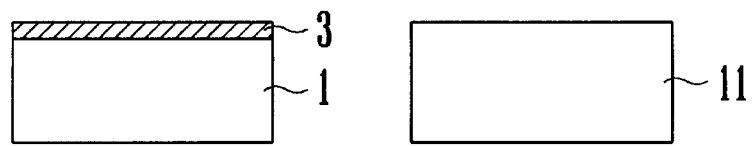
FIGS. 1 to 5 are sectional views respectively illustrating sequential steps of a conventional SOI wafer fabrication method.
Figure 2:
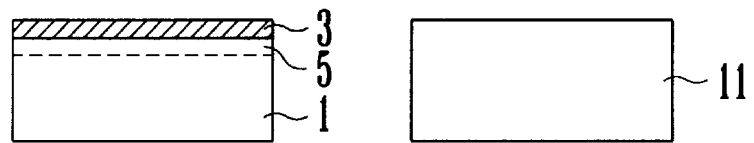
Figure 3:
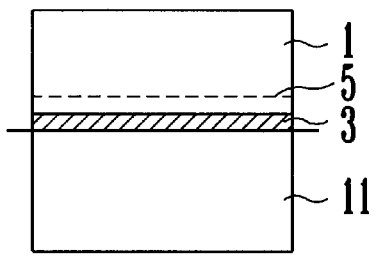
Figure 4:
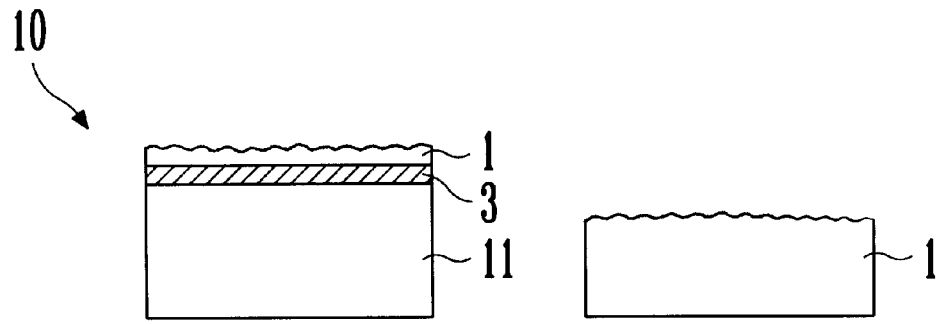
Figure 5:
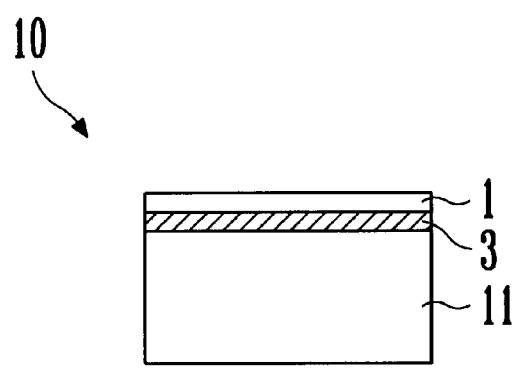
Figure 6:
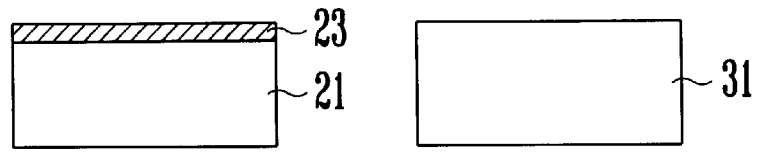
FIGS. 6 to 10 are sectional views respectively illustrating sequential steps of a method for fabricating an SOI wafer in accordance with a first embodiment of the present invention.

In accordance with this method, a first wafer 21 and a second wafer 31 are first prepared, as shown in FIG. 6. The surface of the first wafer 21 is then thermally oxidized, so that a thermal oxide film 23 is formed to a desired thickness over the first wafer 21.

The formation of the thermal oxide film 23 is achieved by carrying out a thermal process at a temperature of about 900 to 1,100° C. for 30 to 60 minutes.

Figure 7:
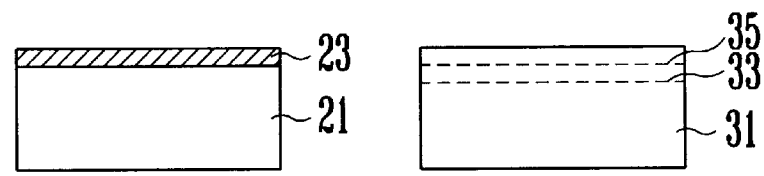

Thereafter, oxygen ions are implanted in the second wafer 31 which is a bare wafer, thereby forming an oxygen ion-implanted region 33, as shown in FIG. 7. Hydrogen ions are also implanted in the second wafer 31, thereby forming a hydrogen ion-implanted region 35 shallower than the oxygen ion-implanted region 33.

The implantation of oxygen ions is carried out using ion implantation energy of 10 KeV to 2 MeV and a dose of $1 \times 10^{12}/cm^2$ to $1 \times 10^{16}/cm^2$ in accordance with the thickness of the wafer. The implantation of hydrogen ions is carried out using ion implantation energy of 10 KeV to 2 MeV and a dose of $1 \times 10^{16}$ to $1 \times 10^{17}/cm^2$ in accordance with the purpose of the wafer.

Figure 8:
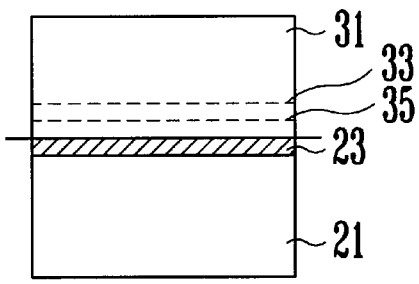

The first wafer 21 is subsequently bonded to the second wafer 31 in such a manner that the thermal oxide film 23 formed over the first wafer 21 is bonded to the hydrogen ion-implanted region 35 of the second wafer 31, as shown in FIG. 8.

The resulting structure, in which the first and second wafers 1 and 11 are bonded to each other, is annealed at a temperature of about 400 to 600° C.

Figure 9:
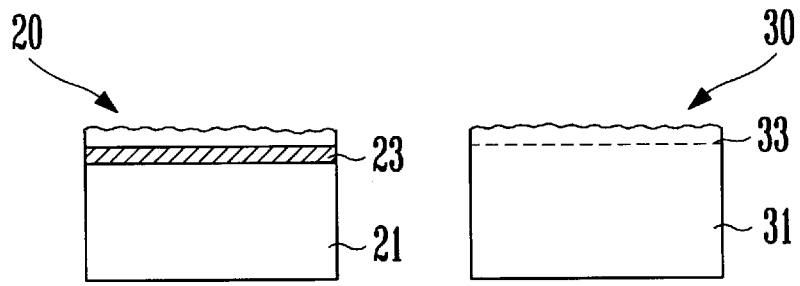

As shown in FIG. 9, the resulting structure is cut along its portion where the hydrogen ion-implanted region 35 is formed, thereby dividing it into a first SOI wafer 20 and a second SOI wafer 30 which is a bare wafer.

Figure 10:
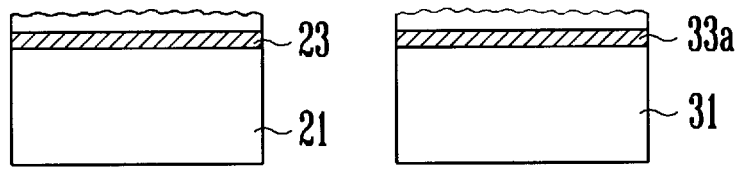

The first SOI wafer 20 is then annealed at a temperature of about 900 to 1,200° C. so that it has a strengthened chemical coupling property, as shown in FIG. 10. The second SOI wafer 30 is also annealed at a temperature of about 900 to 1,200° C. for about 30 to 100 minutes in a nitrogen or oxygen atmosphere, thereby oxidizing the oxygen existing in the oxygen ion-implanted region 33 of the second SOI wafer 30. As a result, an oxide film 33a is formed in the second SOI wafer 30, as in the case using the SIMOX method.

Subsequently, the first and second wafers 20 and 30 are processed to reduce their surface roughness. Thus, two SOI wafers are obtained.

The reduction of the roughness is achieved using a CMP method.

The chemical mechanical polishing is carried out under the condition using a table speed ranging from 15 rpm to 40 rpm, a back pressure of the polishing head ranging less than 2 psi, and a wafer-depressing pressure of the polishing head ranging less than 9 psi. In the chemical mechanical polishing process, a KOH or $NH_4OH$-based slurry is used as a polishing material.

Figure 11:
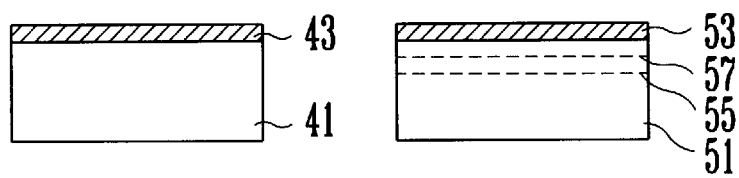
FIGS. 11 and 12 are sectional views respectively illustrating sequential steps of a method for fabricating an SOI wafer in accordance with a second embodiment of the present invention.
Figure 12:
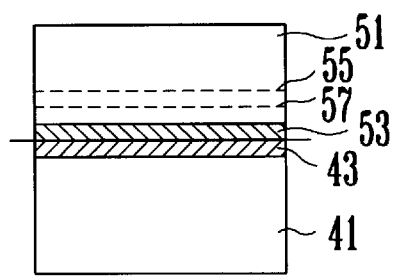

On the other hand, FIGS. 11 and 12 are sectional views respectively illustrating sequential steps of a method for fabricating an SOI wafer in accordance with a second embodiment of the present invention.

In accordance with this method, a first wafer 41 and a second wafer 51 are first prepared, as shown in FIG. 11. The surfaces of the first and second wafers 41 and 51 are then thermally oxidized, so that first and second thermal oxide films 43 and 53 having desired thicknesses are formed over the first and second wafers 41 and 51, respectively.

The formation of the first and second thermal oxide films 43 and 53 are achieved by carrying out a thermal process at a temperature of about 900 to 1,100° C. for 30 to 60 minutes. Preferably, the first and second thermal oxide films 43 and 53 have a thickness of about 500 to 10,000 Å.

Thereafter, oxygen ions are implanted in the second wafer 51, thereby forming an oxygen ion-implanted region 55. Hydrogen ions are also implanted in the second wafer 51, thereby forming a hydrogen ion-implanted region 57.

The implantation of oxygen ions is carried out using ion implantation energy of 10 KeV to 2 MeV and a dose of $1\times10^{12}/cm^2$ to $1\times10^{16}/cm^2$ in accordance with the thickness of the wafer. The implantation of hydrogen ions is carried out using ion implantation energy of 10 KeV to 2 MeV and a dose of $1\times10^{16}$ to $1\times10^{17}/cm^2$ in accordance with the purpose of the wafer.

The second wafer 51 is subsequently bonded to the first wafer 41 in such a manner that the second thermal oxide film 53 formed over the second wafer 51 i s bonded to the first thermal oxide film 43 of the first wafer 41, as shown in FIG. 12.

The resulting structure, in which the first and second wafers 41 and 51 are bonded to each other, is annealed at a temperature of about 400 to 600° C.

Finally, the resulting structure is subjected to the process of FIG. 10 carried out in the first embodiment of the present invention. Thus, two SOI wafers are obtained.

As apparent from the above description, the semiconductor wafer fabrication method of the present invention provides various effects as follows.

In accordance with the semiconductor wafer fabrication method of the present invention, a thermal oxide film is formed over one of two wafers whereas an oxygen ion-implanted region and a hydrogen ion-implanted region are formed in the other wafer. The resulting wafers are bonded to each other and then annealed. The resulting structure is then cut along the hydrogen ion-implanted region, thereby obtaining two SOI wafers. Accordingly, it is possible to simplify the entire wafer fabrication process while achieving an improvement in the productivity of SOI wafers.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating semiconductor wafers, comprising the steps of:

providing a first wafer and a second wafer;

forming a thermal oxide film over the first wafer;

implanting oxygen ions in the second wafer, thereby forming an oxygen ion-implanted region;

implanting hydrogen ions in the second wafer, thereby forming a hydrogen ion-implanted region shallower than the oxygen ion-implanted region;

bonding the upper surface of the second wafer to the upper surface of the thermal oxide film formed over the first wafer;

annealing the bonded wafers;

cutting the bonded wafers along the hydrogen ion-implanted region, thereby forming a first silicon-on-insulator (SOI) wafer and a bare wafer;

annealing the first SOI wafer, thereby strengthening a chemical coupling property of the first SOI wafer;

annealing the bare wafer in such a manner that the oxygen ion-implanted region included in the bare wafer is oxidized, thereby forming a second SOI wafer; and planarizing the surfaces of the first and second SOI wafers.

2. The method in accordance with claim 1, wherein the formation of the thermal oxide film is carried out by annealing the first wafer at a temperature of about 900 to 1,100° C. for about 30 to 60 minutes.

3. The method in accordance with claim 1, wherein the formation of the thermal oxide film has a thickness of about 500 to 10,000 Å.

4. The method in accordance with claim 1, wherein the formation of the hydrogen ion-implanted region is carried out using ion implantation energy of 10 KeV to 2 MeV.

5. The method in accordance with claim 1, wherein the formation of the hydrogen ion-implanted region is carried out using a dose of $1\times10^{16}/cm^2$ to $1\times10^{17}/cm^2$.

6. The method in accordance with claim 1, wherein the formation of the oxygen ion-implanted region is carried out using ion implantation energy of 10 KeV to 2 MeV.

7. The method in accordance with claim 1, wherein the formation of the oxygen ion-implanted region is carried out using a dose of $1\times10^{12}/cm^2$ to $1\times10^{16}/cm^2$.

8. The method in accordance with claim 1, wherein the annealing of the bonded wafers is carried out at a temperature of about 400 to 600° C.

9. The method in accordance with claim 1, wherein the annealing of the first SOI wafer is carried out at a temperature of about 900 to 1,200° C.

10. The method in accordance with claim 1, wherein the annealing of the second SOI wafer is carried out at a temperature of 900 to 1,200° C. for about 30 to 100 minutes in a nitrogen or oxygen atmosphere.

11. The method in accordance with claim 1, wherein the planarizing step is carried out using a chemical mechanical polishing method.

12. The method in accordance with claim 1, wherein the planarizing step is carried out under the condition using a table speed ranging from 15 rpm to 40 rpm, a back pressure of the polishing head ranging less than 2 psi, and a wafer-depressing pressure of the polishing head ranging less than 9 psi, while using a KOH or $NH_4OH$-based slurry.

13. A method for fabricating semiconductor wafers, comprising the steps of:

providing a first wafer and a second wafer;

forming a first thermal oxide film over the first wafer;

forming a second thermal oxide film over the second wafer;

sequentially implanting oxygen ions and hydrogen ions in the second wafer, thereby forming an oxygen ion-implanted region and a hydrogen ion-implanted region;

bonding the upper surface of the second wafer to the upper surface of the first wafer;

annealing the bonded wafers;

cutting the bonded wafers along the hydrogen ion-implanted region, thereby forming a first silicon-on-insulator (SOI) wafer and a bare wafer;

annealing the first SOI wafer, thereby strengthening a chemical coupling property of the first SOI wafer;

annealing the bare wafer in such a manner that the oxygen ion-implanted region included in the bare wafer is oxidized, thereby forming a second SOI wafer; and planarizing the surfaces of the first and second SOI wafers.

14. The method in accordance with claim 13, wherein the thermal oxide films are formed to a thickness of about 500 to 10,000 Å by annealing the associated wafers at a temperature of about 900 to 1,100° C. for about 30 to 60 minutes.

15. The method in accordance with claim 13, wherein the formation of the hydrogen ion-implanted region is carried out using ion implantation energy of 10 KeV to 2 MeV and a dose of $1\times10^{16}/cm^2$ to $1\times10^{17}/cm^2$.

16. The method in accordance with claim 13, wherein the formation of the oxygen ion-implanted region is carried out using ion implantation energy of 10 KeV to 2 MeV and a dose of $1 \times 10^{12}/cm^2$ to $1 \times 10^{16}/cm^2$.

17. The method in accordance with claim 13, wherein the annealing of the bonded wafers is carried out at a temperature of about 400 to 600° C.

18. The method in accordance with claim 13, wherein the annealing of the first SOI wafer is carried out at a temperature of about 900 to 1,200° C.

19. The method in accordance with claim 13, wherein the annealing of the second SOI wafer is carried out at a temperature of 900 to 1,200° C. for about 30 to 100 minutes in a nitrogen or oxygen atmosphere.

20. The method in accordance with claim 13, wherein the planarizing step is carried out in accordance with a chemical mechanical polishing method under the condition using a table speed ranging from 15 rpm to 40 rpm, a back pressure of the polishing head ranging less than 2 psi, and a wafer-depressing pressure of the polishing head ranging less than 9 psi, while using a KOH or $NH_4OH$-based slurry.

\* \* \* \* \*